(12) United States Patent
Ginetti

(10) Patent No.: US 8,719,754 B1
(45) Date of Patent: May 6, 2014

(54) SYSTEM AND METHOD TO GENERATE RE-USEABLE LAYOUT COMPONENTS FROM SCHEMATIC COMPONENTS IN AN IC DESIGN WITH HIERARCHICAL PARAMETERS

(71) Applicant: Cadence Design Systems, Inc., San Jose, CA (US)

(72) Inventor: Arnold Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/750,659

(22) Filed: Jan. 25, 2013

Related U.S. Application Data

(63) Continuation-in-part of application No. 13/632,931, filed on Oct. 1, 2012, which is a continuation of application No. 13/270,056, filed on Oct. 10, 2011, now Pat. No. 8,281,272.

(60) Provisional application No. 61/529,754, filed on Aug. 31, 2011.

(51) Int. Cl.
  *G06F 17/50* (2006.01)

(52) U.S. Cl.
  USPC .......................................................... 716/119

(58) Field of Classification Search
  USPC .......................................................... 716/119
  See application file for complete search history.

(56) References Cited

U.S. PATENT DOCUMENTS

| | | | |
|---|---|---|---|
| 6,671,866 B2 | 12/2003 | Arsintescu | |
| 7,543,262 B2 | 6/2009 | Wang et al. | |
| 7,546,556 B1 * | 6/2009 | Wagner | 716/110 |
| 7,555,739 B1 | 6/2009 | Ginetti et al. | |
| 7,932,566 B2 | 4/2011 | Hou et al. | |
| 7,971,175 B2 | 6/2011 | Ginetti et al. | |
| 8,046,730 B1 | 10/2011 | Ferguson et al. | |
| 8,281,272 B1 | 10/2012 | Ginetti | |
| 2011/0307854 A1 * | 12/2011 | Lu et al. | 716/119 |
| 2012/0144361 A1 * | 6/2012 | Cheng et al. | 716/132 |
| 2012/0233576 A1 * | 9/2012 | Barrows et al. | 716/103 |
| 2012/0266126 A1 | 10/2012 | Chern et al. | |
| 2013/0042216 A1 * | 2/2013 | Loh et al. | 716/119 |

FOREIGN PATENT DOCUMENTS

WO   2009082403 A1   7/2009

OTHER PUBLICATIONS

"U.S. Appl. No. 13/270,056, Notice of Allowance mailed Jun. 5, 2012", 8 pgs.

(Continued)

*Primary Examiner* — Suresh Memula
(74) *Attorney, Agent, or Firm* — Kenyon & Kenyon LLP

(57) ABSTRACT

A method is provided to align poly features within chain sets in an integrated circuit layout design stored in a non-transitory computer readable storage device comprising: vertically aligning a first poly feature of a first pcell instance in a first chain set with a second poly feature of a second pcell instance in a second chain set; configuring a computer to, starting with the aligned first and second poly features, successively determine multiple changed poly feature spacing values associated with at least one of the first and second pcell instances to align successive poly features in chain order in a first horizontal direction; and assigning respective determined changed poly feature spacing values to their associated first or second pcell instances.

20 Claims, 14 Drawing Sheets

(56) References Cited

OTHER PUBLICATIONS

Bhushan, P., et al., "Schematic PCell Implementation in Virtuoso® Platform", Proceedings of the International Cadence Users Group Conference, Santa Clara, CA, (Sep. 13-15, 2004), 12 pgs.
"U.S. Appl. No. 13/632,931, Non Final Office Action mailed Apr. 11, 2013", 4 pgs.
Velasco et al., "An efficient algorithm for optimal pairing and chaining layout generation," 1996 IEEE Int'l Symp. on Circuits and Systems, vol. 4, pp. 775-778.
Velasco et al., "A Combined Pairing and Chaining Algorithm for CMOS Layout Generation," 1996 IEEE, p. 609.
Chen et al., "Transistor Permutation for Better Transistor Chaining," 2009 IEEE, pp. 1276-1279.
Lin et al., "A Graph-Theoretical Approach to Transistor Placement in CMOS Cell Layout," 1990 IEEE, pp. 551-554.
Liberali et al., "Automatic Generation of Transistor Stacks for CMOS Analog Layout," 1993 IEEE, pp. 2098-2101.
Hwang et al., "A Fast Transistor-Chaining Algorithm for CMOS Cell Layout," IEEE Trans. on CAD, vol. 9, No. 7, Jul. 1990, pp. 781-786.
Cadence Design Systems, Inc., "Product Documentation", Virtuoso® Layout Suite XL User Guide, Product Version 6.1.5, Mar. 5, 2012, pp. 1/22 to 2/22.

* cited by examiner

SYSTEM AND METHOD TO GENERATE RE-USEABLE LAYOUT COMPONENTS FROM SCHEMATIC COMPONENTS IN AN IC DESIGN WITH HIERARCHICAL PARAMETERS

CROSS-REFERENCE TO RELATED APPLICATIONS

This application is a continuation of U.S. patent application Ser. No. 13/632,931, filed Oct. 1, 2012 which is a continuation-in-part of U.S. Pat. No. 8,281,272 filed on Oct. 10, 2011 and issued Oct. 2, 2012, which claims the benefit of priority, under 35 U.S.C. Section 119(e), to U.S. Provisional Patent Application Ser. No. 61/529,754, filed on Aug. 31, 2011, which are hereby incorporated by reference herein in their entirety.

BACKGROUND

In a cell-based IC design, repetitive blocks of circuitry are represented by cells that may be accessed from a design cell library using the software tool. Circuit designers can create a custom design of integrated circuits, printed-circuit boards, and other electronic circuit systems using electronic design automation (EDA) technologies that typically run on an operating system in conjunction with a microprocessor-based computer system or other programmable control system. For analog, RF, and mixed signal design applications, the EDA software allows a user to implement "cells" as a basic element of functionality through a layout editor implemented on a graphical user interface. A given cell may be placed, or "instanced," many times in a layout design to accelerate the design process. In a cell-based hierarchical IC design, cells disposed higher in an IC design hierarchy may contain instances of other cells lower in the hierarchy. A schematic design cell higher in the hierarchy provides a graphical visual representation of the circuit functionality and hides from the user much of the detail and complexity of design cells lower in the hierarchy. A layout design comprises layout cells. A layout cell contains instances of layout cells and/or physical geometries (e.g., a metal1 stripe).

Often, dummy polysilicon ('poly') features are inserted into a layout design to enhance critical dimensions during photolithography and etching processes. As used herein, "dummy poly features" shall refer to polysilicon shapes added to a layout design to ensure correct electrical behavior or correct physical fabrication, and/or otherwise support the integrated circuit manufacturing process. The insertion of dummy poly shapes can improve the regularity of poly and enable tuning of the optical proximity correction (OPC) recipe for improved process windows. For example, dummy poly features often are inserted between cells or between active devices, e.g., transistors, in a layout.

A parameterized cell, or 'pcell', is a programmable cell that allows creation of a customized instance of the pcell each time it is placed or used in design. A pcell is typically more flexible than a non-parameterized cell (non pcell) because different instances of the pcell may have different parameter values. For example, with a transistor pcell, the length, width, number of gate segments, and/or other design elements of the transistor, can be realized by simply inserting or changing one or more parameter values. Rather than have many different cell definitions to represent the variously sized transistors in a given design, a single pcell may take a transistor's dimensions (e.g., width and length) as parameters. Different instances of a single pcell can then represent transistors of different sizes, but otherwise similar characteristics.

When instantiating a parameterized cell, a designer specifies values for parameters associated with the parameterized cell. A layout pcell is used to generate geometric structures used in a layout design. A schematic pcell is a variant of a layout pcell, which can be used in schematic designs. The use of pcells obviates the need to store individual instances of each cell. Rather, pcells are evaluated and instantiated when a design is opened, for example. The parameters of a pcell typically are used to determine the geometric dimensions of a corresponding circuit element represented by the pcell. Thus, complex geometric structures that make up circuit elements in an electronic design typically can be generated automatically based upon parameters specified by a circuit designer using a design tool. For example, a circuit designer may assemble a design that comprises multiple cells and may associate parameters with the cells. The design tool uses the parameters to generate geometric structures, represented in software data structures that correspond to actual physical structures that will be used to implement circuit elements represented by corresponding design cells.

A pcell supermaster is a type of parameterized cell that is encoded in a computer readable device and that typically is associated with a list of parameters, parameter types, parameter default values and with logic in the form of computer program code. A designer specifies parameter values of its parameters for the pcell supermaster. An automated design tool uses the logic of the pcell supermaster to generate a cell referred to as a pcell submaster that complies with the user-specified parameter values. Persons skilled in the art will appreciate that a pcell submaster typically is created by evaluating pcell code associated with the supermaster, for a given unique set of parameter values. In a typical session of an automated design tool usage, all regular cell instances of the same pcell supermaster that share the same parameter values typically also will share the same pcell submaster. Thus, instances of a regular cell within a design may be copies of a pcell submaster.

FIG. 1 is an illustrative diagram representing an data structure 100 of a parameterized cell (pcell) that is encoded in a computer readable storage device in accordance with certain prior art. The example parameterized cell data structure 100 includes a supermaster object 102 that includes computer program logic to determine geometric structures, and also includes parameter definitions and default values. Submaster objects 104-1 to 104-N are associated with the supermaster and represent different instances of the design cell that contain different unique geometries produced using code from the supermaster 102 and different unique sets of parameter values. Cell instances 106-1 to 106-N of the design cell inherit geometries from corresponding submasters 104-1 to 104-N.

More specifically, the circuit element represented by the illustrative example parameterized design cell data structure 100 of FIG. 1 is an nmos transistor. The supermaster 202 defines parameters L (length) and W (width) and includes program logic (not shown) to determine dimensions of geometric structures associated with the nmos transistor based upon parameter values. Each of the submasters 104-1 to 104-N represents a different unique instance of the nmos transistor determined with the supermaster logic using a different unique parameter value. For example, assume that a pcell supermaster 102 defines two integer parameters, namely "width" and "length". As well, assume that pcell supermaster is associated with software logic specifying to create a rectangle corresponding to the user-specified values for a width parameter and a length parameter on some hard-coded layer within a circuit design, such as "metal1". A designer could instantiate that pcell supermaster within a design and specify on the created instance the width parameter value to be 5 and the length parameter value to be 2. At that point, the tool application can be used to automatically create a pcell submaster 104-1 that will contain a rectangle of width=5 and length=2 on layer metal1. It will be appreciated that often the code associated with a pcell supermaster not only can be used to create geometries but also can be used to instantiate some lower level cell.

In addition to parameters for transistor length, width and number of gate segments, for example, a pcell also may include parameters for dummy polysilicon (poly) features associated with the design cell. The physical dimensions and spacing of devices must comply with design rules that ensure that the layout design complies with fabrication requirements. For instance, in some modern design processes (e.g., 20 nm and below), there is a rule which requires that a diffusion cannot have devices (e.g., transistors) of different widths. In other words, for example, all gate poly segments within a diffusion area should have the same width. Another common rule requires that when two chains of devices of different width are getting close together, they must be separated with dummy poly features of increasing size (from the smaller device width to the greater device width). The term "chain" conventionally refers to a set of devices sharing the same diffusion region. Also, another rule specifies the spacing in between all those poly features as a function of their width.

Moreover, in accordance with certain typical design rules, a chain often is required to be bordered by dummy poly features. A chain typically is implemented using one or more pcells. When implemented with only pcell, that pcell should contain at least two devices (to make a chain, you must be at least 2). If implemented with several pcells, then each pcell would have one or more devices.

Therefore, a pcell includes parameters for dummy features that may include, for example, a parameter indicating a number of dummy poly features disposed to the left of a transistor diffusion region, a parameter indicating a number of dummy poly features disposed to the right of the transistor diffusion region, parameters indicating size, e.g., length and/or width of the dummy poly features to the left and to the right of the diffusion region, parameters indicating spacing of dummy poly features disposed to the left and to the right of a dummy poly. The parameters for dummy features also may include parameters specifying location, size and spacing of dummy transistors associated with a transistor diffusion region.

SUMMARY

In one aspect, a method is provided to align polysilicon features within chain sets in an integrated circuit layout design. A first poly feature of a first pcell instance in a first chain set is aligned with a second poly feature of a second pcell instance in a second chain set. Starting with the aligned first and second poly features, poly feature spacing values suitable for aligning successive poly features in the chains are successively determined for at least one of the first or second pcells. The poly feature spacing values are assigned to their associated first or second pcells for use in generating updated pcell instances in which poly features are in proper alignment.

DESCRIPTION OF EMBODIMENTS

Figure 1:
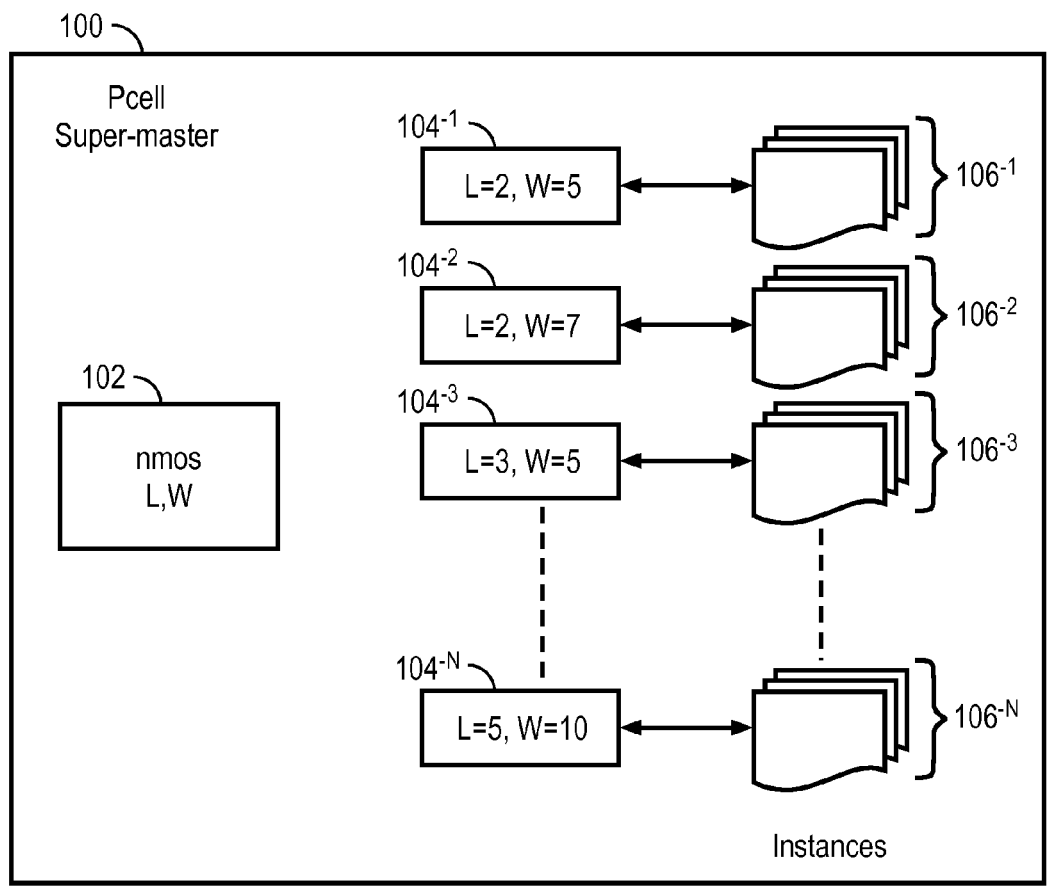
FIG. 1 is an illustrative diagram representing an data structure of a parameterized cell (pcell) that is encoded in a computer readable storage device in accordance with certain prior art.

The following description is presented to enable any person skilled in the art to create and use a method and system to align dummy polysilicon features within an integrated circuit design. Various modifications to the example embodiments herein will be readily apparent to those skilled in the art, and the principles defined herein may be applied to other embodiments and applications without departing from the spirit and scope of the present disclosure. Moreover, in the following description, numerous details are set forth for the purpose of explanation. However, one of ordinary skill in the art will realize that the present disclosure might be practiced without the use of these specific details. In other instances, well-known data structures and processes are shown in block diagram form in order not to obscure the description of the present disclosure with unnecessary detail. Identical reference numerals may be used to represent different views of the same item in different drawings. Flow diagrams in drawings referenced below are used to represent processes. A computer system is configured to perform these processes. The flow diagrams include modules that represent the configuration of a computer system according to computer program code to perform the acts described with reference to these modules. Thus, the present disclosure is not intended to be limited to the example embodiments shown herein, but is to be accorded the widest scope consistent with the principles and features disclosed herein.

Figure 2:
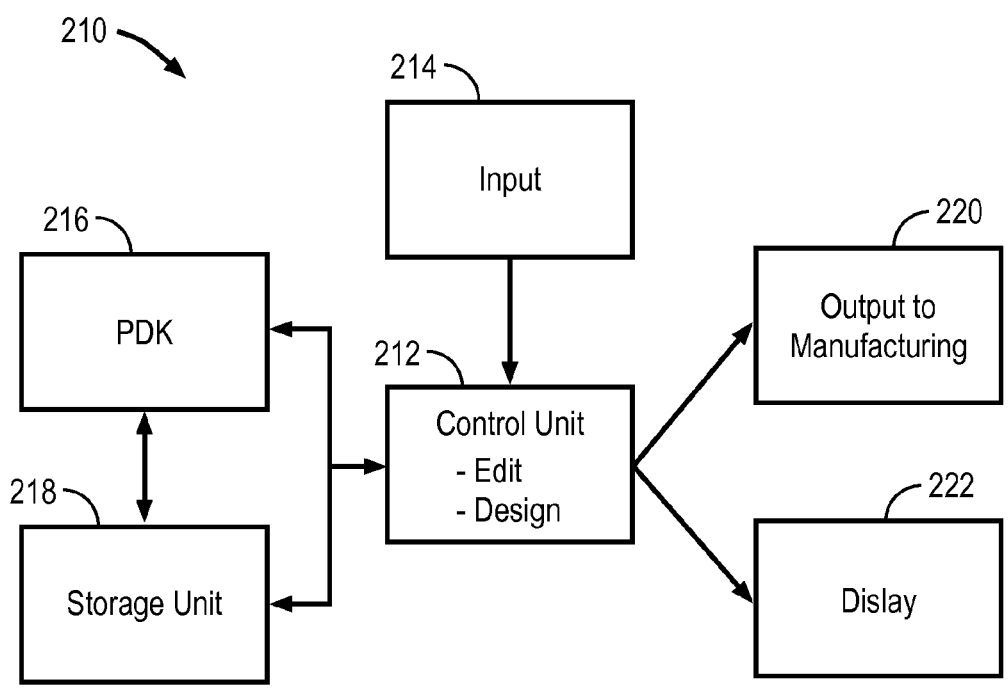
FIG. 2 is a schematic block diagram illustrating operational components of an Electronic Design Automation design system in accordance with an embodiment of the present general inventive concept.

FIG. 2 is a schematic block diagram illustrating operational components of an electronic Design Automation (EDA) design system 210 in accordance with an embodiment of the present general inventive concept. These components are illustrated for purposes of convenience in describing aspects of the present general inventive concept and should not be construed as essential components of each and every embodiment of the present general inventive concept. As illustrated in FIG. 2, the electronic design system 210 may include a control unit 212, an input unit 214, a process design kit (PDK) 216, a storage unit 218, an output device 220, and a graphical user interface display unit 222. The control unit 212 may implement a processor-based control system to control and integrate operations of the design system 210. For example, the control unit 212 may include a software-based graphic design environment executing software program(s) to assist a user in generating and streamlining electronic layout designs.

The input unit 214 may take the form of a keyboard, mouse, pointer, or other input generating device to facilitate input of control instructions by a user to the control unit 212. The PDK 216 may contain information specific to a particular design task including libraries of symbols and views, pcells, technology files, and physical verification files, provided in suitable file formats and having an interface interconnected with the control unit 212 to enable a user to access cell level design solutions and optimize layout designs interactively via the input unit 14 and visual display unit 222. For example, one or more process design kits (PDK) 216 may be interconnected with the control unit 212 to provide a plurality of manufacturing-related parameters—from design rules to characterized models—to ensure a design will be manufacturable according to the user's original design intent. The assortment of component libraries of the PDK 216 can be collections of electronic devices stored in digital formats, and may be accessible by the EDA control unit 212. The digital content of the library may be stored locally, or accessed remotely via a computer network. The physical verification files can be provided in the PDKs to help ensure correctness and appropriateness of design choices via a variety of design rules issued with the PDK.

The cells provided with the PDK may be accessed by the designer by way of a graphical user interface or layout editor visualized by the display 222.

Pcells reduce design entry time and design rule violations, while providing an accelerated level of design automation to minimize tedious and repetitive layout tasks. As such, pcells may be used to support the ability of a user to change the size, shape, or contents of each cell instance without changing or losing the original cell content. By lowering to the component level of the design hierarchy, pcells simplify the manner in which complex shapes and devices can be generated, edited, and managed with variable settings, thus accelerating layout tasks and reducing design violations.

The storage unit 218 may comprise one or more non-transitory memory storage devices, for example, RAM, ROM, cache, data registers, or other types of virtual or disk memory to facilitate storage and manipulation of program code, data, PDKs, and the like. The design system 210 may further include an output unit 220 to facilitate physical implementation of a user's custom designs by providing a direct link to manufacturing processes at the silicon or chip level.

Figure 3A:
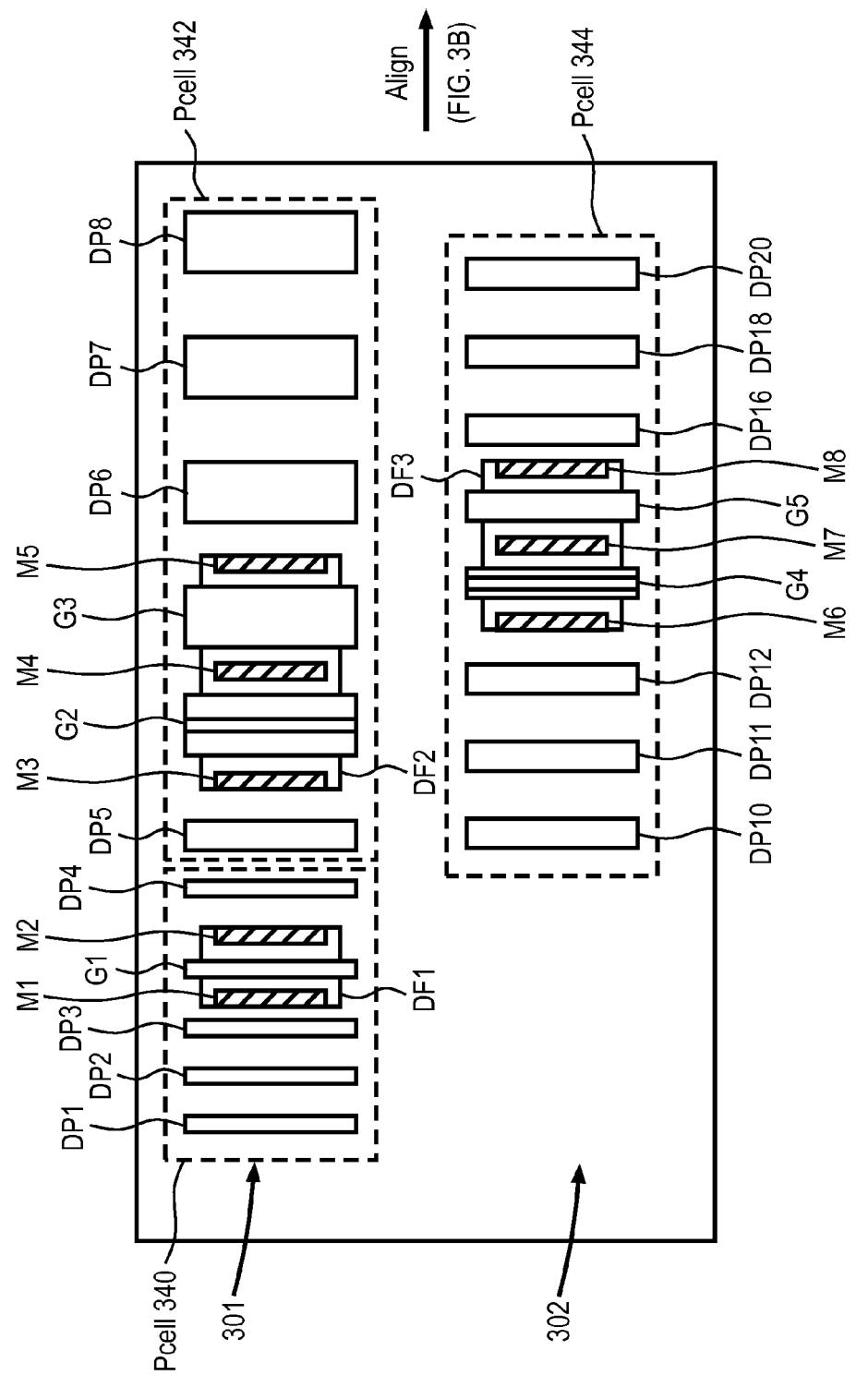
FIGS. 3A-3B are an illustrative drawings showing displays produced on a graphical user interface screen of device layout designs that are in close proximity of each other within an integrated circuit layout design before (FIG. 3A) and after (FIG. 3B) alignment of polysilicon features in accordance with some embodiments.
Figure 3B:
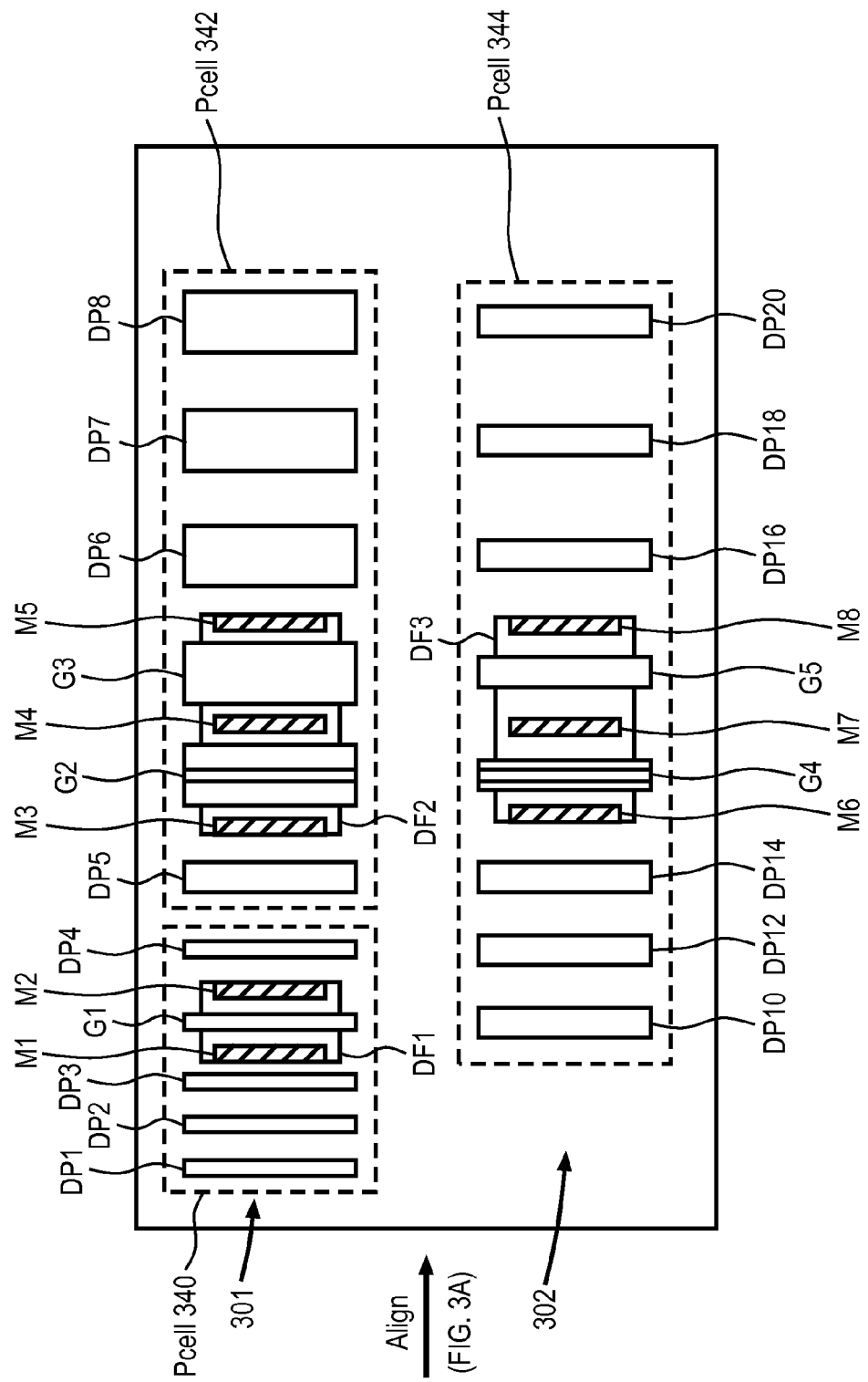

FIGS. 3A-3B are illustrative drawings showing displays produced on a graphical user interface screen of multiple device layout designs that are in close proximity of each other within an integrated circuit layout design 300 before (FIG. 3A) and after (FIG. 3B) alignment of polysilicon features in accordance with some embodiments. As explained above, alignment of poly features of an integrated circuit design often is required to make the design suitable for use in fabrication of an actual integrated circuit device. A first (top) chain set 301 and a second (bottom) chain set 302 each include multiple horizontally arranged components. As used herein, the term "chain" refers to a set of poly structures including multiple gate polys sharing the same diffusion region and also refers to set of poly structures that includes one gate poly traversing a diffusion region in combination with one or more dummy polys. For example, a diffusion region spanned by multiple gate poly features comprises multiple transistor devices that share that same diffusion region. As used herein, the term "chain set" refers to one or more chains that are disposed in the same horizontal row in close horizontal proximity to each other in a layout design. Thus, in this document the term "chain set" may be used to refer to a single chain slated for alignment with another chain in a different row or to refer to multiple chains in the same row that are slated for alignment with another chain set in a different row. As explained below, the poly features of a chain set can be aligned as a group with one or more other chain sets in a different horizontal row in the layout design. The first chain set 301 and the second chain set 302 are disposed physically adjacent to each other in the design with the first chain set 301 being disposed in a row vertically 'above' a row in which the second chain set 302 in the design is disposed. It will be appreciated that the terms above and below and left and right and vertical and horizontal are relative terms used for convenience of explanation.

The top chain set 301 is composed of two pcell instances, pcell instance 340 and pcell instance 342. The pcell instance 340 defines a one-transistor device and several dummy polys. More specifically, the pcell instance 340 includes one device that includes a poly gate G1 that spans diffusion area DF1 and four dummy poly, DP1, DP2, DP3 and DP4, and two metal contact M1 and M2. The pcell instance 342 defines two transistor devices and several dummy polys. More particularly, pcell instance 342 includes two devices in the form of poly gates G2 and G3 that span diffusion area DF2. It will be appreciated that together, gates G2, G3 constitute a chain. The pcell instance 344 also includes four dummy poly, DP5, DP6, DP7 and DP8, and 3 metal contacts M3, M4 and M5. It will be appreciated that the pcell instances 340, pcell instance 342 and pcell instance 344 are implemented as information structures in stored in a non-transitory computer readable storage.

A second (bottom) chain set 302 is composed of one pcell instance, pcell instance 344. The pcell instance 344 defines a two-transistor device and several dummy polys. In particular, the pcell instance 340 includes two devices in the form of two poly gates G3-G4 that span a third diffusion region DF3 and that constitute a chain. The pcell instance 344 also includes, dummy polys DP10-DP20 and metal contacts M6-M8. The second chain set 302 also includes a third diffusion region DF3. The fourth and fifth gates G4 and G5 extend across the third diffusion region DF3. Metal contacts M6-M8 are disposed within the third diffusion region DF3 such that each of gates G4 and G5 is bounded on each side by one of the metal contacts M6-M8.

A first pcell indicated by dashed lines labeled pcell instance 340 comprises the first diffusion region DF1, gate G1 and dummy polys DP1-DP4 plus metal M1-M2. A second pcell indicated by dashed lines labeled pcell instance 342 comprises the second diffusion region DF2, gates G2, G3 and dummy polys DP5-DP8 plus metal M3-M5. A third pcell indicated by dashed lines labeled pcell instance 344 comprises the third diffusion region DF3, gates G4, G5 and dummy polys DP10-DP20 plus metal M6-M8.

In this illustrative example, a user uses control unit 212 and display 222 to provide an indication that gate poly G2 is to be aligned with gate poly G4. The layout of FIG. 3A may be shown in a screen display generated using a computer implemented layout design editing environment. The indication may include using a computer controlled selection device such as a mouse to point to and select each of gate G2 and gate G4 in the screen display and to then actuate an alignment command. In response to the command, in accordance with some embodiments, the layout is changed to produce the layout design of FIG. 3B, which is shown on the screen display. More specifically, in response to the user command, the poly gates G2 and G4 are aligned automatically without the need for further user guidance. Also, the three closest poly features of the first chain 301 to the left of the user-indicated gate G2, i.e., G1, DP4, DP5 are automatically aligned with three poly features poly features DP10-DP14 to the left of the user-indicated gate G4 in the second chain set 302. In addition, the four poly features G3 and DP6-DP8 to the right of user-indicated gate poly G2 in the first chain 301 are automatically aligned with the gate poly G5 and the three poly features DP16-DP20 in the second chain set 302.

It will be appreciated that the spacing between poly features in the second chain set 302 has been increased in order to align them with poly features in the first chain 301. Specifically, the three poly features DP10-DP14 to the left of the gate G4 and the four poly features G5 and DP16-DP20 to the right of the gate G4 are more spaced apart after the alignment than before it. Thus, alignment of poly features can result in a design that includes greater chip area. Also, in this example, the spacing in between dummy poly DP4, DP5 and device poly G1 of the first chain set has been increased to get aligned to the dummy poly DP4, DP5 and DP6 of the second chain.

In accordance with some embodiments, the changed spacing of poly features resulting from the alignment process results in corresponding changed spacing parameter values for one or more pcell instances corresponding to the components of the second chain 301. Also, the parameter of pcell DPcell instance 340 of chain set 301 have been modified to control the new spacing in between dummy poly DP4, DP5 and device poly G1. In accordance with some embodiments, parameter changes are made on the pcell instance, and in turn, a corresponding pcell submaster is re-generated for the changed pcell instances.

Figure 4:
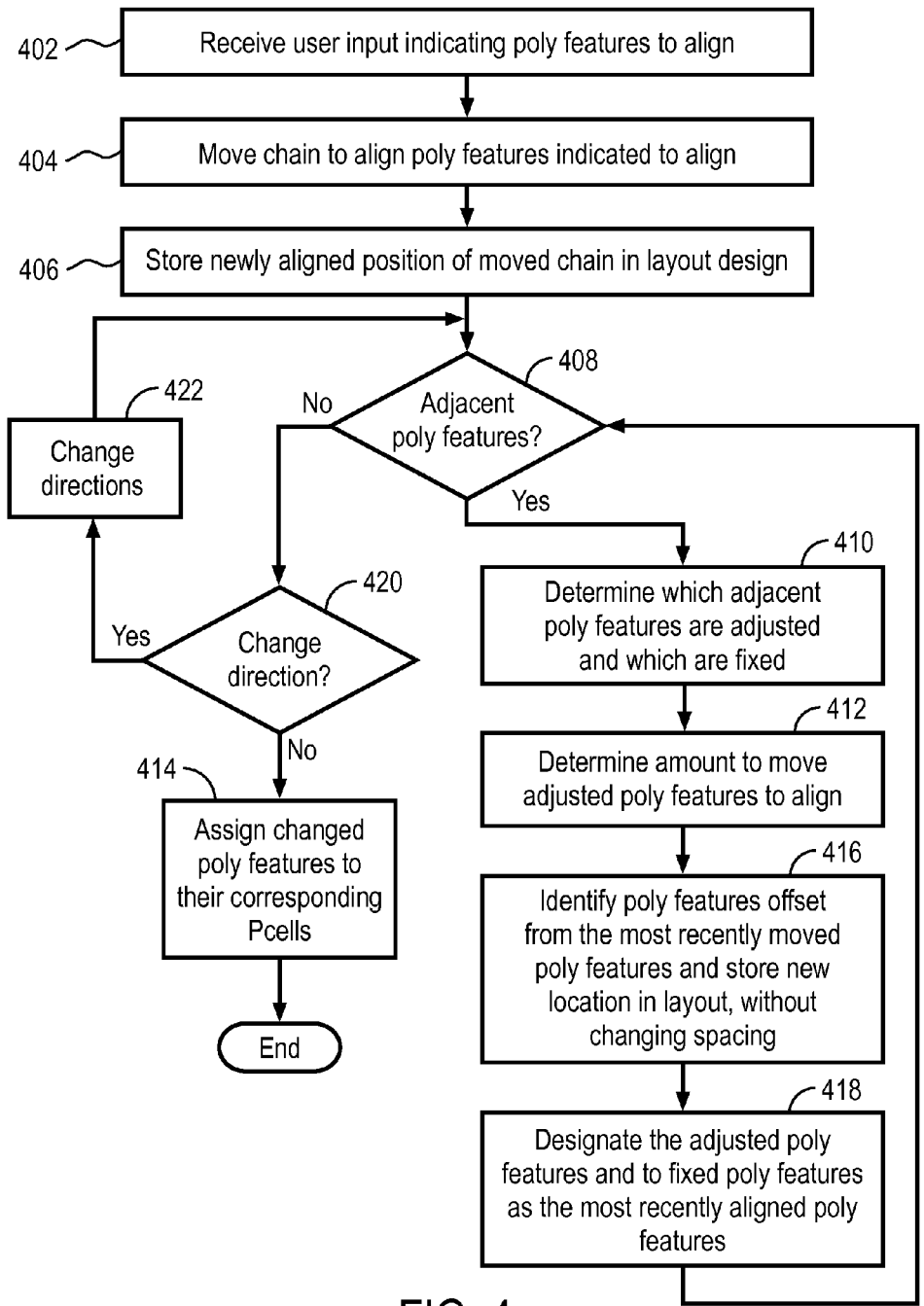
FIG. 4 is an illustrative flow diagram representing a process to vertically align polysilicon features in different chains of an integrated circuit design and to change corresponding pcell parameter in accordance with some embodiments.

FIG. 4 is an illustrative flow diagram representing a process to vertically align polysilicon features in different chains of an integrated circuit design and to change corresponding pcell parameter in accordance with some embodiments. Module 402 receives user input that indicates poly features that are disposed in two or more different vertically offset chains that are to be aligned. In some embodiments, a user also may indicate which chains are to be included in a chain set that is to be moved as a group or that is to be aligned to by a nearby vertically offset chain set and also may indicate which chain or chain set is to be moved. By vertically offset it is meant that the chains, which extend in a horizontal direction, are layed-out in parallel one above the other in a layout design. In some embodiments, the user provides these indications using a computer user interface pointing device. Referring to FIGS. 3A-3B, for example, a user may indicate that a first chain set includes the poly features of pcells pcell instance 340 and pcell instance 342 is to be aligned with a chain set that includes only pcell instance 344.

Module 404 determines a changed layout position of the chain or chain set that is to be moved so as to align the user-indicated poly features. Module 406 stores an indication of the new layout position in the computer readable storage unit 218. Alternatively, the changed location in the layout design can be stored later after changed spacing positions of the other poly features have been determined.

Decision module 408 determines whether for each of at least two most recently aligned poly features, i.e. poly features that have been aligned with each other, there is a poly feature that is adjacent to and offset in a first prescribed from the most recently aligned poly feature. In accordance with some embodiments, the first prescribed direction is to the right. Alternatively, however, the first prescribed direction could be to be to the left.

Module 410, in response to a determination by decision module 408 that there are such adjacent poly features in each of at least two chains, determines the adjacent poly feature that is the most distant from the poly feature that was most recently aligned in its chain, which shall be referred to as a "fixed poly feature". This fixed poly feature will not have a change in its poly spacing within its chain. Other poly features that are less distant from the most recently aligned poly feature in their chains will have a change in poly spacing and shall be referred to as "adjusted poly features".

Module 412 determines for each adjusted poly feature, an amount by which the adjusted poly feature must be moved to align it with the fixed poly feature and temporarily stores in a non-transitory storage device an indication of a spacing adjustment amount for the adjusted poly feature together with an indication of which pcell and which poly feature of that pcell the spacing adjustment pertains to.

Module 416 identifies each poly feature that is offset in the prescribed direction from an adjusted poly feature and changes its position in the layout design by moving it in the prescribed direction by the same amount movement amount as the most recently aligned poly feature in its chain was moved. The relative spacing between these identified poly features and between the identified features and a corresponding adjusted poly feature is unchanged during this change in layout design position.

Module 418 designates the adjusted poly features and the fixed poly feature as the current most recently aligned poly features. It will be appreciated that at the end of each alignment cycle, a new set of current most recently aligned poly features is designated.

Control next flows back to decision module 408.

In response to a determination by decision module 408 that there are not adjacent poly features in each of at least two chains, decision module 420 determines whether alignment has been attempted in a second prescribed direction, e.g. to the left. In response to a determination by decision module 420 that alignment has not yet been attempted in the second prescribed direction, module 422 changes the prescribed direction to the second direction and control again flows to decision module 408.

Control flows to module 414 in response to a determination by decision module 420 that alignment already has been attempted in the in the second prescribed direction. Module 414 assigns the updated poly feature spacing parameters stored pursuant to module 412 to their respective pcell instances, which in turn triggers the corresponding pcell instance sub-master to re-evaluate, i.e, to calculate updated geometries and spacings, based upon the determined spacing adjustment amounts. The poly features of the re-evaluated pcell instance, pcell instance 340 instance, pcell instance 342 instance and pcell instance 344 instance, align automatically as a result of the alignment of the user-selected poly features pursuant to module 402 and the updating of the pcells parameter values using the determinations by modules 410, 412 and 416.

Figure 5A:
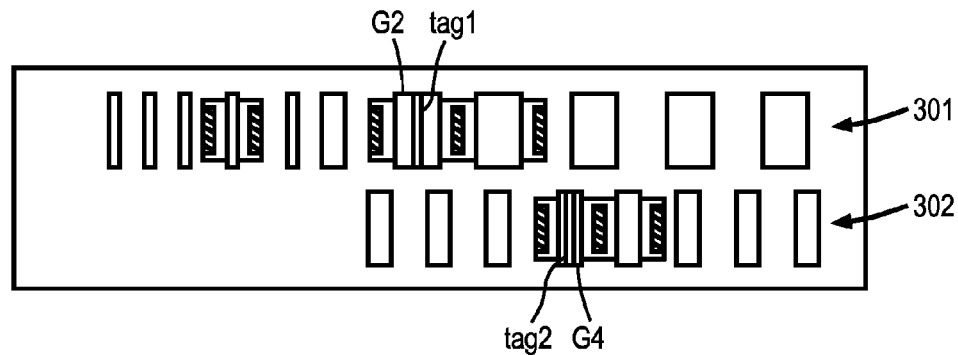
FIGS. 5A-5P are illustrative drawings showing an example of incremental stages of a process implemented using a computer configured to implement the process of FIG. 4 in accordance with some embodiments.
Figure 5B:
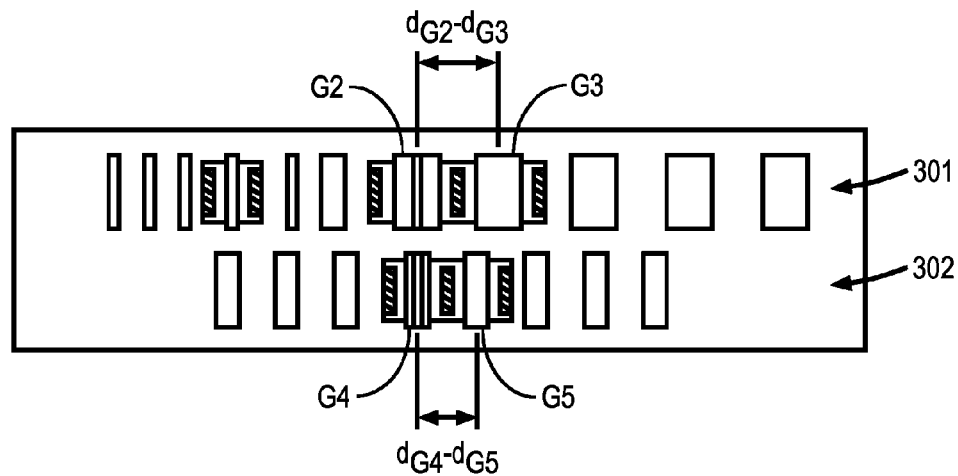
Figure 5C:
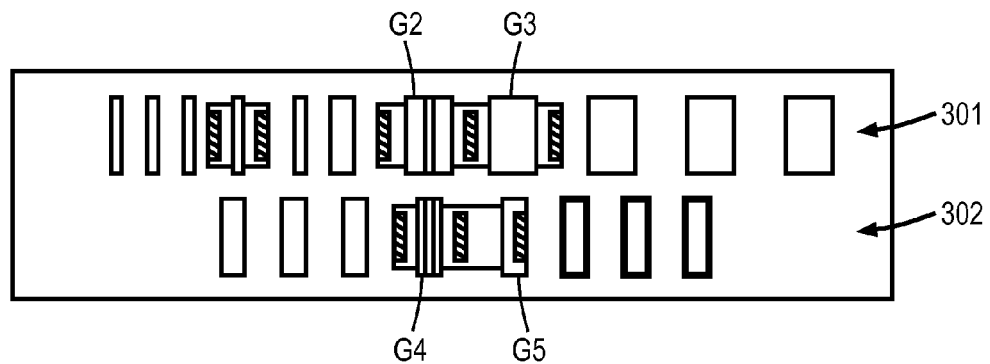
Figure 5D:
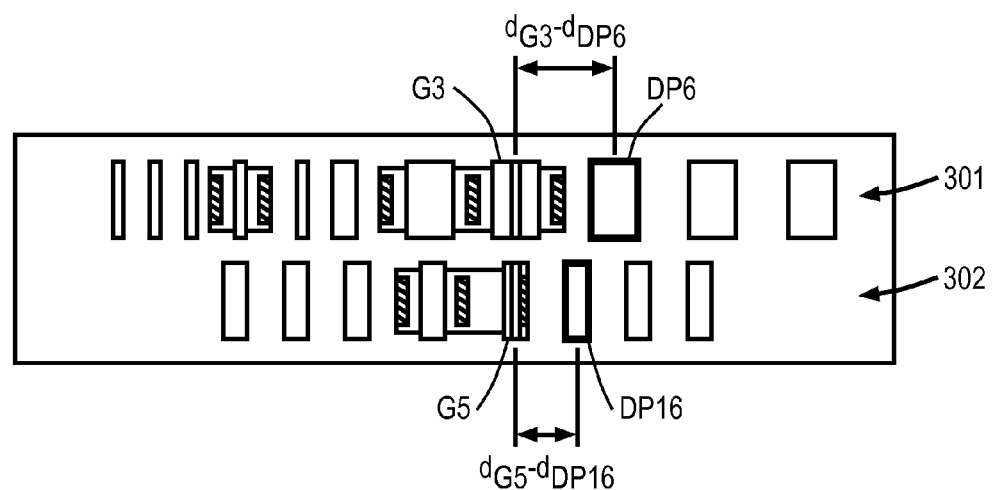
Figure 5E:
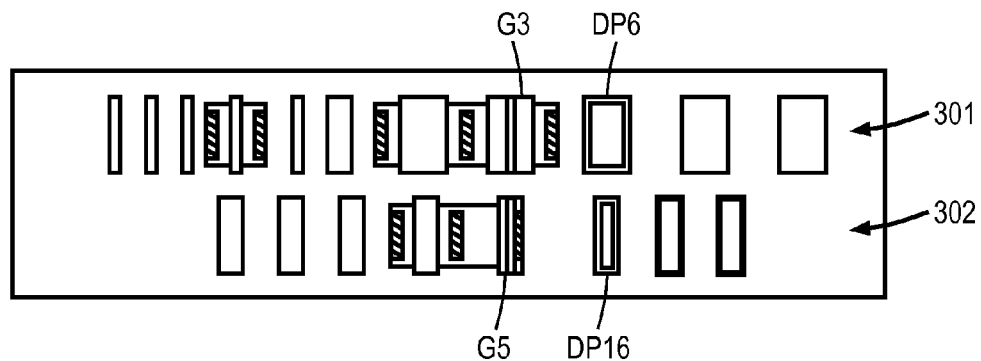
Figure 5F:
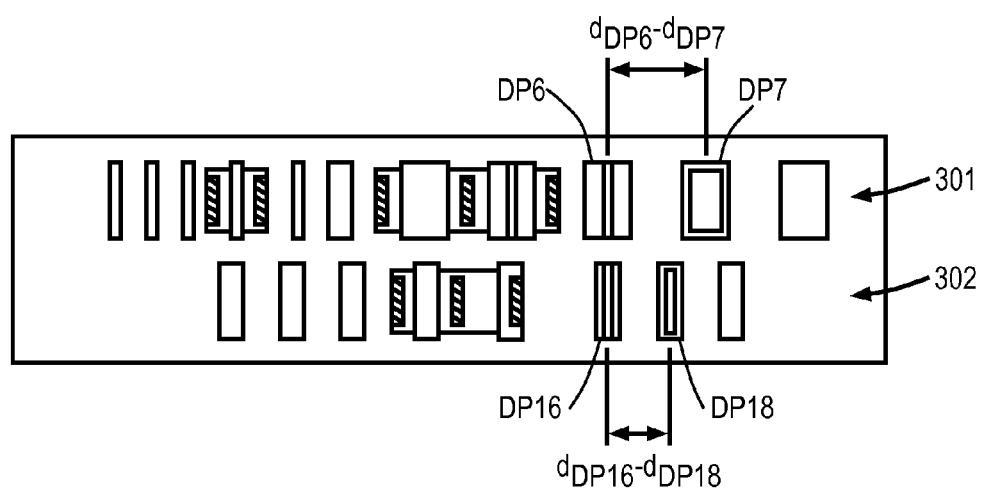
Figure 5G:
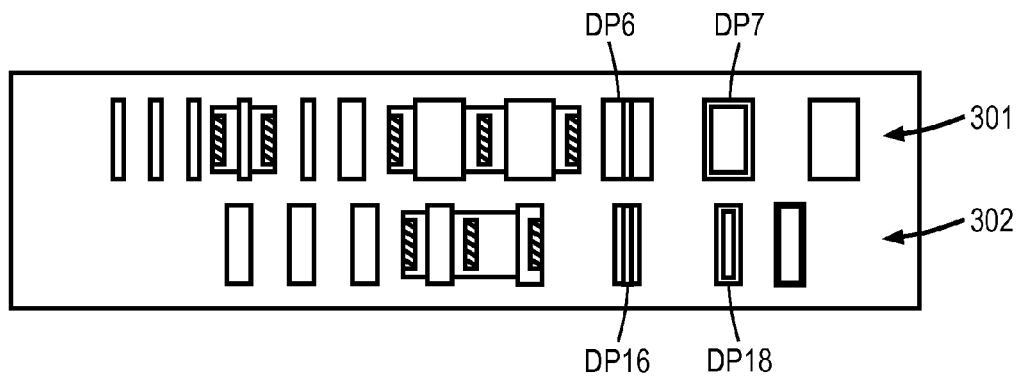
Figure 5H:
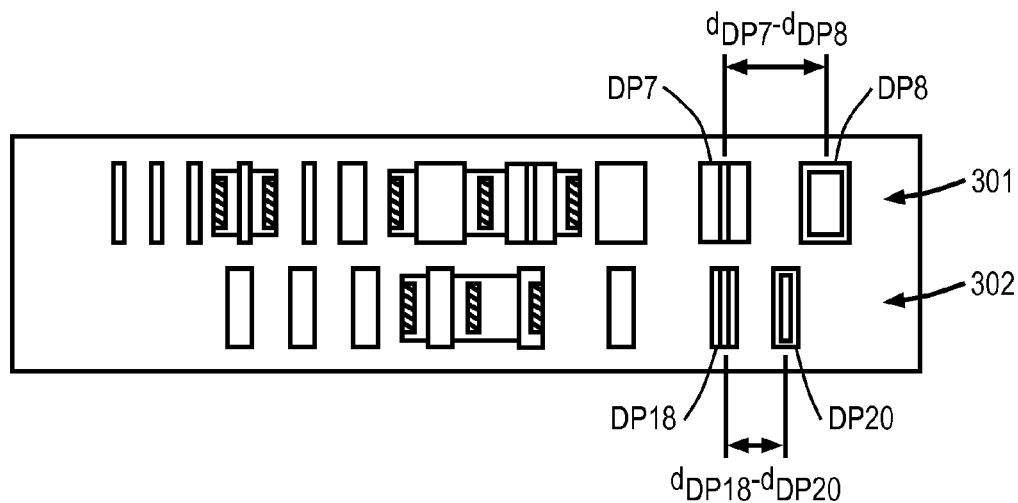
Figure 5I:
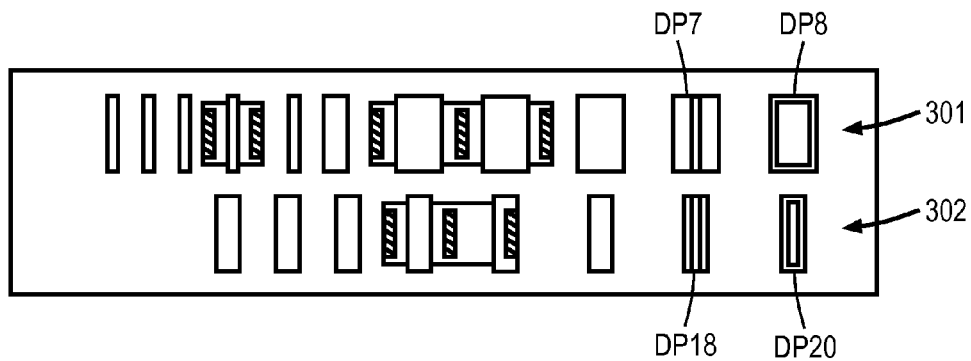
Figure 5J:
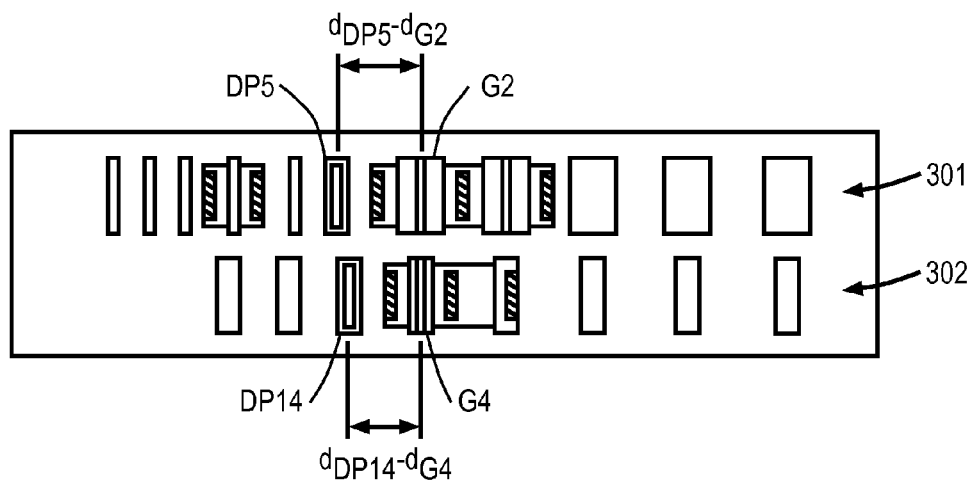
Figure 5K:
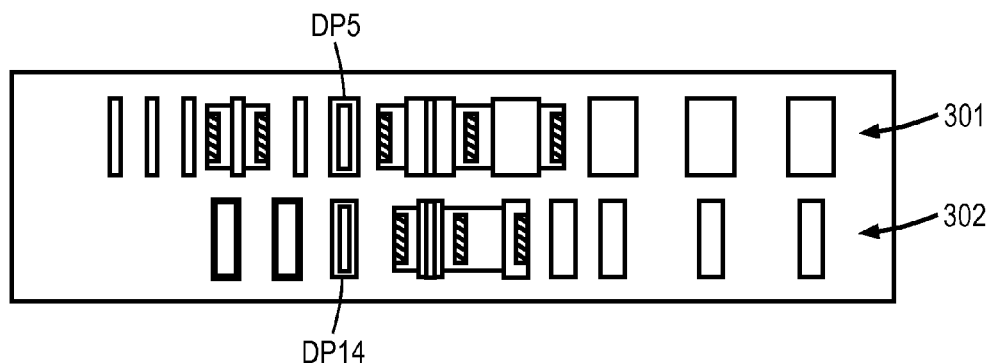
Figure 5L:
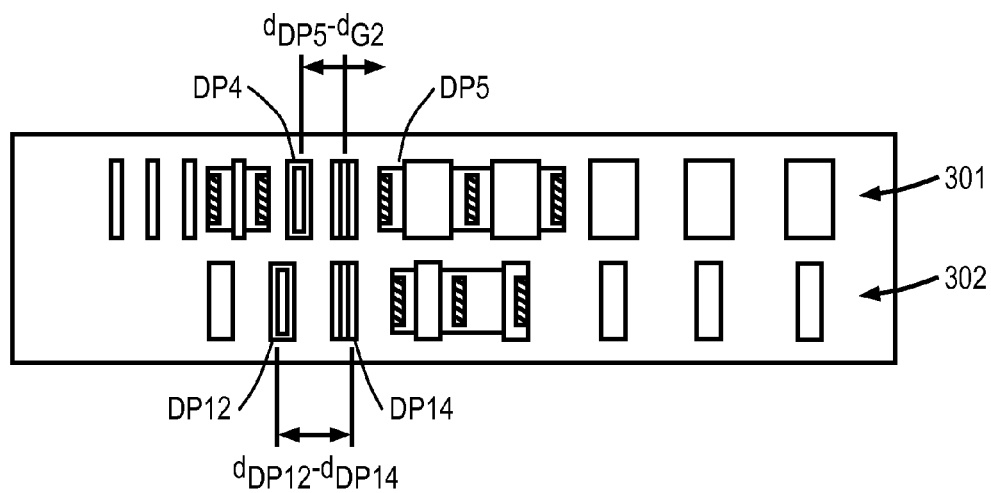
Figure 5M:
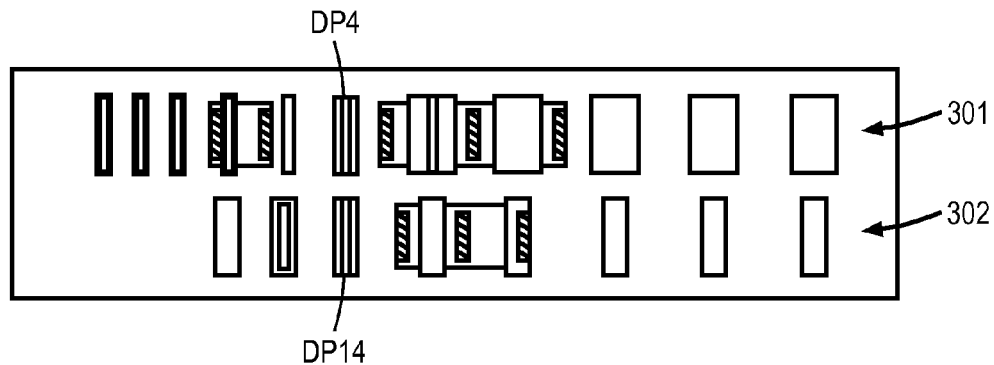
Figure 5N:
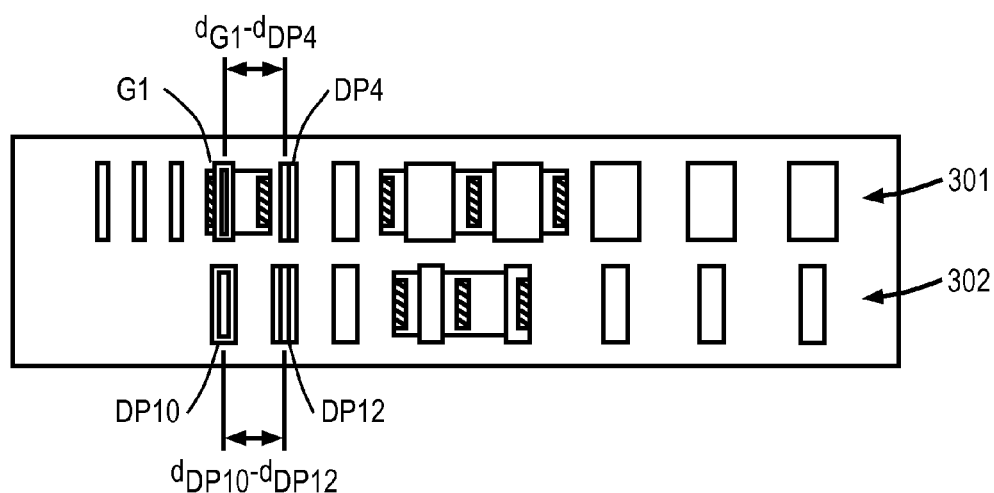
Figure 5O:
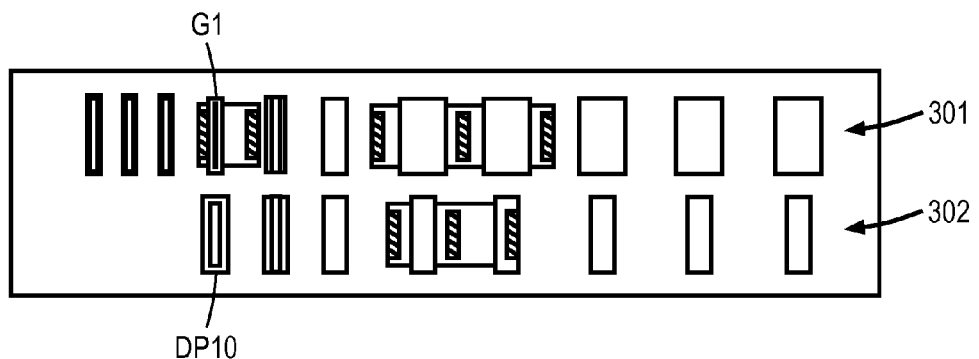
Figure 5P:
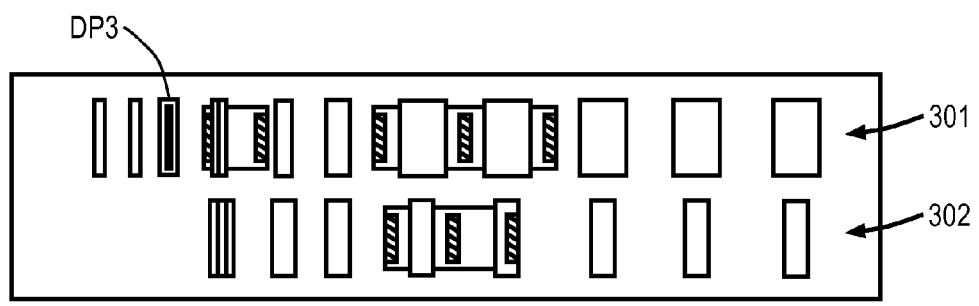

FIGS. 5A-5P are illustrative drawings showing an example of incremental stages of a process implemented using a computer configured to implement the process of FIG. 4 in accordance with some embodiments. The process of FIGS. 5A-5P aligns the chain and the chain set that are described with reference to FIGS. 3A-3B, and the same reference numerals are used in each of these sets of drawings. While FIGS. 3A-3B show the chains before and after alignment, FIGS. 5A-5P illustrate the alignment process in a step-by-step manner.

From the following FIGS. 5A-5P, it will be appreciated that in this example, starting with the aligned first and second poly features G2, G4, poly features are aligned successively, in chain first to the right and then to the left. By chain order, it is meant the order in which poly features occur in the chains. Thus, after G2 and G4 have been aligned, G3 is aligned with G5. Then DP6 is aligned with DP16. Then DP7 is aligned with DP18. Then DP8 is aligned with DP20. The same process then proceeds to the left starting with G2 and G4. DP5 is aligned with DP14. Then DP4 is aligned with DP12. Then G1 is aligned with DP10.

Moreover, it will be appreciated from the following FIGS. 5A-5P, that alignment involves determining for each successive most recently aligned poly features, an adjacent poly feature that is farthest from a most recently aligned poly feature in its chain and adjusting spacing of the other adjacent poly feature in the other chain to align it with the determined farthest adjacent poly feature. By way of overview and generally speaking, in doing the successive alignments, an overall goal is that poly features of the chain having the more compacted together poly features is spread apart to align its poly features with those of the chain having the more spread out poly features.

FIG. 5A is an illustrative drawing in which the user has indicated that gates G2 and G4 are to be aligned. It will be appreciated that the constituent components within the first and second chains 301, 302 correspond to components in an integrated circuit design stored in a computer readable storage device. Receipt of the user input per module 402 of FIG. 4 is indicated by tag markings tag1 and tag2.

FIG. 5B is an illustrative drawing in which the second gate poly G2 and the fourth gate poly G4 have been vertically aligned in response to the user input per module 404 of FIG. 4 in accordance with some embodiments. In this example, the entire second chain set 302 is moved in the same direction, to the left in this example, by an amount to align the second and fourth gates G2 and G4. Spacing between components of the second chain set 302 is unchanged by the move of the entire second chain set 302.

Still referring to FIG. 5B, a nearest poly feature is identified in the first chain 301 that is adjacent to the second gate G2 and in a first direction relative to the second gate G2 per module 408. In this example the first direction is to the right. The identified nearest feature adjacent to and in the first direction (to the right of) the second gate G2 is the third gate G3. Also per module 408, a nearest poly feature is identified in the second chain set 302 that is adjacent to the fourth gate G4 and in the first direction relative to the fourth gate G4. In this example, the identified feature adjacent to and in the first direction (to the right of) the fourth gate G4 is the fifth gate G5. Per module 410, a determination is made of a distance $(d_{G2}-d_{G3})$ between the second gate G2 and the third gate G3, as measured from the centerlines of the gates. Also per module 410, a determination is made of a distance $(d_{G4}-d_{G5})$ between the fourth gate G4 and the fifth gate G5, as measured from the centerlines of the gates. Also per module 410, a greater of the determined distances is identified. In this example the distance $(d_{G2}-d_{G3})$ of the third gate G3 from the second gate G2 is determined to be greater than the distance $(d_{G4}-d_{G5})$ of the fifth gate G5 from the fourth gate G4.

A selection is made as a function of the determined distances as to whether to move the nearest poly feature G3 in the first chain 301 to bring it into alignment with the nearest poly feature G5 in the second chain 301 or to move the nearest poly feature G5 in the second chain set 302 to bring it into alignment with the nearest poly feature G3 in the first chain 301. In accordance with some embodiments, the poly feature that is the nearer to the component in the same chain that was most recently aligned is selected to be moved. In this example, G5 is nearer to G4, than G3 is to G2. More particularly, the distance $(d_{G4}-d_{G5})$ is less than the distance $(d_{G2}-d_{G3})$, and therefore, the fifth gate G5 is moved to bring it into alignment with the third gate G3.

FIG. 5C is an illustrative drawing in which the third gate poly G3 and the fifth gate poly G5 are vertically aligned in accordance with some embodiments. More particularly, per module 412, in accordance with the determination that the fifth gate G5 is closer to the fourth gate G4 than the third gate G3 is to the second gate G2. Per module 414, the fifth gate G5 is moved to the right by an amount $(d_{G4}-d_{G5})$ to align it with the third gate G3. Furthermore, per module 416, each of the components of the second chain set 302 disposed in the first direction relative to (i.e., to the right of) the fifth gate G5 also is moved in that same direction by the same amount as the movement of the fifth gate G5, and the relative spacing between those components remains unchanged.

FIG. 5D is an illustrative drawing showing a determination of distances between the most recently aligned gate polys in each chain and their nearest neighbor poly dummy features per module 410 and 412. In this example, the distance $(d_{G3}-d_{P6})$ between the third gate G3 and poly dummy P6 is greater than a distance $(d_{G5}-d_{P16})$ between the third gate G5 and poly dummy P16.

FIG. 5E is an illustrative drawing in which dummy poly DP6 and dummy poly DP16 are vertically aligned. Per module 414, the dummy poly DP16 in the second chain set 302 has been moved in the first direction to align it with the dummy poly DP6 in the first chain 301. More specifically, dummy poly DP16 is determined to be the "adjusted poly feature" in this example and dummy poly DP6 is determined to be the "fixed poly feature" in this example. Furthermore, per module 416, each of the components of the second chain set 302 disposed in the first direction relative to (i.e., to the right of) the dummy poly DP16 also is moved in that same direction by the same amount as the movement of the dummy poly DP16, and the relative spacing between those components remains unchanged.

FIG. 5F is an illustrative drawing showing a determination of distances between the most recently aligned poly features in each chain and their nearest neighbor poly features in accordance with some embodiments. In this example, per modules 410, 412, the distance $(d_{DP6}-d_{DP7})$ between dummy poly DP6 and dummy poly DP7 is determined to be greater than a distance $(d_{DP16}-d_{DP18})$ between the dummy poly DP16 and poly dummy DP18.

FIG. 5G is an illustrative drawing in which dummy poly DP7 and dummy poly DP18 are vertically aligned. Per module 414, the poly dummy DP18 in the second chain set 302 has been moved in the first direction to align it with the dummy poly DP7 in the first chain 301. Furthermore, per module 416, each of the components of the second chain set 302 disposed in the first direction relative to (i.e., to the right of) the dummy poly DP18 also is moved in that same direction by the same amount as the movement of the dummy poly DP18, and the relative spacing between those components remains unchanged.

FIG. 5H is an illustrative drawing showing a determination of distances between the most recently aligned poly features in the first direction in each chain and their nearest neighbor poly features in accordance with some embodiments. In this example, per modules 410, 412, the distance $(d_{DP7}-d_{DP8})$ between dummy poly DP7 and dummy poly DP8 is greater than a distance $(d_{DP18}-d_{DP20})$ between the dummy DP18 and dummy DP20.

FIG. 5I is an illustrative drawing in which dummy poly DP8 and dummy poly DP20 are vertically aligned. Per module 414, the poly dummy DP20 in the second chain set 302 has been moved in the first direction to align it with the dummy poly DP8 in the first chain 301. Furthermore, per module 416, each of the components of the second chain set 302 disposed in the first direction relative to (i.e., to the right of) the dummy poly DP20 also is moved in that same direction by the same amount as the movement of the dummy poly DP20, and the relative spacing between those components remains unchanged.

With dummy poly DP8 aligned with dummy poly DP20, all features disposed in the first direction (i.e., to the right of) relative to the selected gate polys G2, G4. Accordingly, per modules 420, 422, the alignment process proceeds to align poly features in the second direction (i.e., to the left of) relative to the selected gate polys G2, G4.

FIG. 5J is an illustrative drawing showing a determination of distances between the gate polys G2, G4 selected by the user in each chain and their nearest neighbor poly features in a second direction in accordance with some embodiments. Per modules 410, 412, the distance ($d_{DP5}$-$d_{G2}$) between dummy poly DP5 and second gate poly G5 is greater than a distance ($d_{DP14}$-$d_{G4}$) between the dummy DP14 and gate G4.

FIG. 5K is an illustrative drawing in which poly dummy DP5 and poly dummy DP14 are vertically aligned. Per module 414, the poly dummy DP14 in the second chain set 302 has been moved in the second direction to align it with the dummy poly DP5 in the first chain 301. More specifically, since the dummy poly DP14 is closer to the gate poly G4 than dummy poly DP6 is to the gate poly G3 in the first chain 301, the dummy poly DP14 is moved to align it with the dummy poly DP5. Furthermore, per module 416, each of the components of the second chain set 302 disposed in the second direction relative to (i.e., to the left of) the dummy poly DP14 also is moved in that same direction by the same amount as the movement of the dummy poly DP14, and the relative spacing between those components remains unchanged.

FIG. 5L is an illustrative drawing showing a determination of distances between the most recently aligned poly features in the second direction in each chain and their nearest neighbor poly features in accordance with some embodiments. Per modules 410, 412, the distance ($d_{DP4}$-$d_{DP5}$) between dummy poly DP4 and dummy poly DP5 is greater than a distance ($d_{DP12}$-$d_{DP14}$) between the dummy DP12 and dummy DP14.

FIG. 5M is an illustrative drawing in which poly dummy DP4 and poly dummy DP12 are vertically aligned. Per module 414, the poly dummy DP12 in the second chain set 302 has been moved in the second direction to align it with the dummy poly DP4 in the first chain 301. Since the dummy poly DP12 is closer to dummy poly DP14 than dummy poly DP4 is to dummy poly DP5 in the first chain 301, the dummy poly DP12 is moved to align it with the dummy poly DP4. Moreover, per module 416, each of the components of the second chain set 302 disposed in the second direction relative to (i.e., to the left of) the dummy poly DP12 also is moved in that same direction by the same amount as the movement of the dummy poly DP12, and the relative spacing between those components remains unchanged.

FIG. 5N is an illustrative drawing showing a determination of distances between the most recently aligned poly features in the second direction in each chain and their nearest neighbor poly features in accordance with some embodiments. Per modules 410, 412, the distance ($d_{DP10}$-$d_{DP12}$) between the dummy DP10 and dummy DP12 is greater than a distance ($d_{G1}$-$d_{DP4}$) between first gate poly G1 and dummy poly DP4.

FIG. 5O is an illustrative drawing in which gate poly G1 and dummy poly DP10 are vertically aligned. Per module 414, the gate poly G1 in the first chain 301 has been moved in the second direction to align it with the dummy poly DP10 in the second chain set 302. Since the gate poly G1 is closer to dummy poly DP4 in the first chain 301 than dummy poly DP10 is to dummy poly DP12 in the second chain 301, the gate poly G1 is moved to align it with the dummy poly DP10. Moreover, per module 416, each of the components of the first chain 301 disposed in the second direction relative to (i.e., to the left of) the dummy gate G1 also is moved in that same direction by the same amount as the movement of the gate poly G1, and the relative spacing between those components remains unchanged.

FIG. 5P is an illustrative drawing representing the final alignment of poly structures of the first and second chains 301, 302 in accordance with some embodiments. Per modules 408-420, since there are no more poly features to be aligned in the first and second chains, the process ends.

Figure 6:
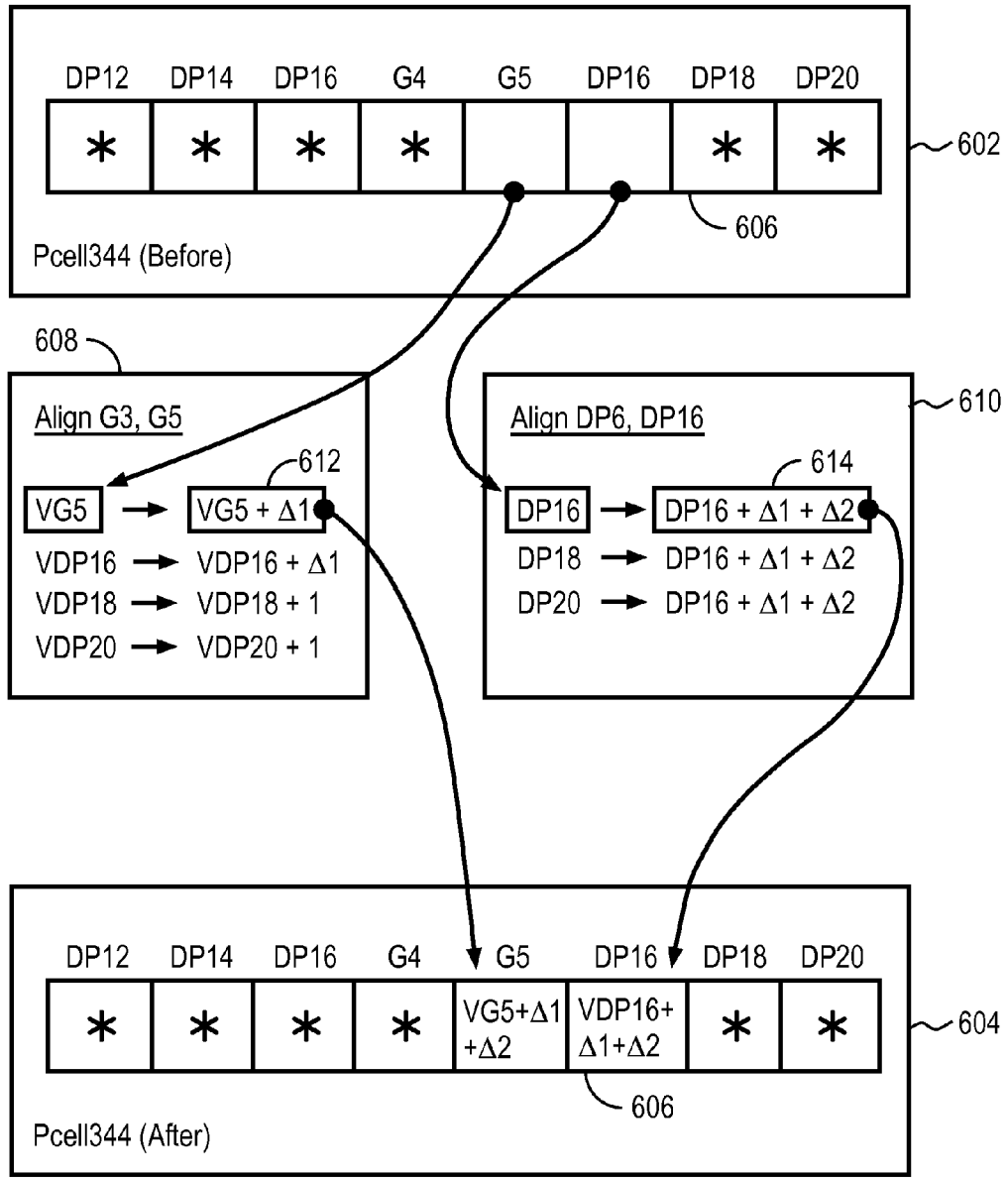
FIG. 6 is an illustrative drawing representing changes in poly spacing parameters of a pcell of FIGS. 3A-3B as a result of the process of FIG. 4 in accordance with some embodiments.

FIG. 6 is an illustrative drawing representing changes in poly spacing parameters of pcell instance 344 of FIGS. 3A-3B as a result of the process of FIG. 4 in accordance with some embodiments. An information structure labeled pcell instance 344(before) represents the pcell instance 344 instance before the alignment process of FIG. 4. An information structure labeled pcell instance 344(after) represents the pcell instance 344 instance after the alignment process of FIG. 4. The pcell instance 344 instance (both before and after versions) stores poly feature spacing parameters 606 for the poly feature geometries defined by pcell instance 344. In this example, only the poly feature spacing parameters for gate G5 and dummy poly DP16 are shown. In order to simplify the drawing, values for the other poly feature spacing parameters are not shown and are indicated as *. Although it will be appreciated that actual poly feature spacing parameters would be provided for these features in an actual pcell instance.

Block 608 represents example processing using a computer configured in accordance with modules 412 and 416 of FIG. 4 to align gate G5 and gate G3 as shown in FIGS. 5B-5C. A spacing value VG5 is read from the pcell instance 344 (before) structure. In this example, the spacing value VG5 is a distance from some reference location such as the centerline of gate G4, for example. Module 412 determines a new spacing value (VG5+$\Delta$1) that is stored temporarily in a storage device location 612. Referring to FIG. 5B, the value $\Delta 1=[(d_{G2}-d_{G3})-(d_{G4}-d_{G5})]$. Module 416 determines an updated spacing value for dummy features DP16 to be VDP16+$\Delta$1, for DP18 to be VDP18+$\Delta$1 and for DP20 to be VDP20+$\Delta$1. The updated spacing value VG5+$\Delta$1 is assigned to the pcell instance 344(after)

Block 610 represents example processing using a computer configured in accordance with modules 412 and 416 of FIG. 4 to align dummy feature DP6 and dummy feature DP16 as shown in FIGS. 5D-5E. A spacing value VDP16 is read from the pcell instance 344(before) structure. In this example, the spacing value VDP16 is a distance from some reference location such as the centerline of gate G4, for example. Module 412 determines a new spacing value (VDP16+$\Delta$1+$\Delta$2) that is stored temporarily in a storage device location 614. Referring to FIG. 5E, the value $\Delta 2=[(d_{G3}-d_{P6})-(d_{G5}-d_{P16})]$. Module 416 determines an updated spacing value for dummy feature DP18 to be VDP16+$\Delta$1+$\Delta$2 and for DP20 to be VDP20+$\Delta$1+$\Delta$2. The updated spacing value (VDP16+$\Delta$1+$\Delta$2) is assigned to the pcell instance 344(after).

It will be appreciated that similar processing occurs for each of the "adjusted poly features".

Thus, the alignment process of FIG. 4 results in changing parameter values that indicate spacing of poly features of a pcell. The example of FIGS. 5A-5P shows incremental steps in an alignment process resulting in changes in poly feature spacing parameter values associated with pcell instance 344 for the following poly features: DP12-DP20 and G5. (See FIGS. 5C, 5E, 5G, 5I, 5K and 5M.) The example of FIGS.

5A-5P shows incremental steps in an alignment process resulting in changes in poly feature spacing parameter values associated with pcell instance 340 for the following poly feature: G1. (See, FIG. 5O.) After updated spacing values have been determined for all "adjusted poly features", the updated parameter values are moved from temporary storage, e.g., storage 612, 614, and are loaded to the storage locations 604 of the pcell instance 344(after). In response to the loading of the new parameters, the automatically pcell instance 344 re-evaluates geometric shapes, i.e. poly features and their spacing, and generates revised chain set geometric shapes resulting in the automatic alignment of the "adjusted poly features" determined using the process of FIG. 4. It will be appreciated that in accordance with some embodiments, once a user indicates the poly features of two vertically adjacent chains that are that are to be aligned and issues an alignment command, alignment and spacing of multiple poly features is achieved automatically without further user involvement. Thus, a user is freed from the laborious task of individually moving and realigning each poly feature. Moreover, changed spacing resulting from the movements and realignments are stored automatically as changes to corresponding pcell instance parameters so that the pcell instance sub-masters can be generated.

Although the present disclosure has been described in connection with some embodiments, it is not intended to be limited to the specific form set forth herein. It will be appreciated, for example, that the process of FIG. 4 can be used to align more than two chains. A user could indicate selection of a poly feature in each of three or more vertically displaced chains, and the process could be used to align poly features in the three or more chains. One skilled in the art would recognize that various features of the described embodiments may be combined in accordance with the present disclosure. Moreover, it will be appreciated that various modifications and alterations may be made by those skilled in the art without departing from the spirit and scope of the present disclosure.

In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

The invention claimed is:

1. A method to align poly features within chain sets in an integrated circuit layout design stored in a non-transitory computer readable storage device comprising:
    vertically aligning a first poly feature of a first pcell instance in a first chain set with a second poly feature of a second pcell instance in a second chain set;
    configuring a computer to, starting with the aligned first and second poly features, successively determine multiple changed poly feature spacing values associated with at least one of the first and second pcell instances to align successive poly features in chain order in a first horizontal direction; and
    assigning each respective determined changed poly feature spacing value to its associated first or second pcell instance.

2. The method of claim 1 further including:
configuring a computer to, starting with the aligned first and second poly features, successively determine multiple changed poly feature spacing values associated with at least one of the first and second pcell instances to align successive poly features in chain order in a second horizontal direction.

3. The method of claim 1 further including:
using at least one of the first and second pcell instance to re-generate at least one of the first or second chain sets to produce aligned poly features in the layout design.

4. The method of claim 1 further including:
using at least one of the first and second pcell instances to re-generate at least one of the first and second chain sets so that the first and second chain sets align with each other in the layout design when the first poly feature and the second ploy feature are aligned with each other in the layout design.

5. The method of claim 1,
wherein at least one of the changed poly feature spacing values is determined for the first pcell instance
wherein at least one other of the changed poly feature spacing values is determined for the second pcell instance;
wherein assigning the determined changed poly feature spacing values includes assigning the at least one changed poly feature spacing value to the first pcell instance and
wherein assigning the determined changed poly feature spacing values includes assigning the at least one other the changed poly feature spacing value to the second pcell instance.

6. The method of claim 4 further including:
using the first pcell instance, having the at least one changed poly feature spacing value assigned to it, to re-generate the first chain set; and
using the second pcell instance, having the at least one other changed poly feature spacing value assigned to it, to re-generate the second chain set.

7. The method of claim 1,
wherein successively aligning poly features in chain order in a first horizontal direction includes,
    for each successive most recently aligned poly feature, determining an adjacent poly feature that is farthest from a most recently aligned poly feature in the first horizontal direction in its chain and adjusting spacing of the other adjacent poly feature in the other chain to align it with the determined farthest adjacent poly feature.

8. The method of claim 2,
wherein successively aligning poly features in chain order in a second horizontal direction includes,
    for each successive most recently aligned poly features, determining an adjacent poly feature that is farthest from a most recently aligned poly feature in the second horizontal direction in its chain and determining an adjusted spacing of the other adjacent poly feature in the other chain to align it with the determined farthest adjacent poly feature.

9. The method of claim 1,
wherein the first chain set includes multiple dummy poly features; and
wherein the first chain set includes multiple dummy poly features.

10. The method of claim 1,
wherein the first chain set includes multiple dummy poly features and multiple gate poly features; and
wherein the first chain set includes multiple dummy poly features.

11. The method of claim 1,
wherein the first chain set includes multiple pcell instances.

12. The method of claim 1 further including:
using at least one of the first and second pcell instances to re-generate at least one of the first or second chain sets to produce aligned poly features in the layout design;
wherein the first chain set includes a third pcell instance; and
aligned poly features in the layout design include a poly feature of the first pcell instance aligned with a poly feature of the second pcell instance and includes a poly feature of the first pcell aligned with a poly feature of the second pcell instance.

13. An article of manufacture that includes a non-transitory computer readable storage device that that includes computer readable code to cause a computer to perform a method to align poly features within chain sets in an integrated circuit layout design, the method comprising;
vertically aligning a first poly feature of a first pcell instance in a first chain set with a second poly feature of a second pcell instance in a second chain set;
configuring a computer to, starting with the aligned first and second poly features, successively determine multiple changed poly feature spacing values associated with at least one of the first and second pcell instances to align successive poly features in chain order in a first horizontal direction; and
assigning each respective determined changed poly feature spacing value to its associated first or second pcell instance.

14. The article of claim 13 further including;
using at least one of the first and second pcell instance to re-generate at least one of the first or second chain sets to produce aligned poly features in the layout design.

15. The article of claim 13 further including:
using at least one of the first and second pcell instances to re-generate at least one of the first and second chain sets so that the first and second chain sets align with each other in the layout design when the first poly feature and the second ploy feature are aligned with each other in the layout design.

16. The article of claim 13,
wherein at least one of the changed poly feature spacing values is determined for the first pcell instance
wherein at least one other of the changed poly feature spacing values is determined for the second pcell instance;
wherein assigning the determined changed poly feature spacing values includes assigning the at least one changed poly feature spacing value to the first pcell instance and
wherein assigning the determined changed poly feature spacing values includes assigning the at least one other the changed poly feature spacing value to the second pcell instance.

17. The article of claim 13,
wherein successively aligning poly features in chain order in a first horizontal direction includes,
for each successive most recently aligned poly feature, determining an adjacent poly feature that is farthest from a most recently aligned poly feature in the first horizontal direction in its chain and adjusting spacing of the other adjacent poly feature in the other chain to align it with the determined farthest adjacent poly feature.

18. A system comprising:
a storage device that stores information representative of an integrated circuit design; and
a computing device in communication with the storage device, the computing device configured to perform a method to align poly features within chain sets in an integrated circuit layout design, the method comprising;
vertically aligning a first poly feature of a first pcell instance in a first chain set with a second poly feature of a second pcell instance in a second chain set;
configuring a computer to, starting with the aligned first and second poly features, successively determine multiple changed poly feature spacing values associated with at least one of the first and second pcell instances to align successive poly features in chain order in a first horizontal direction; and
assigning each respective determined changed poly feature spacing value to its associated first or second pcell instance.

19. The system of claim 18 further including;
using at least one of the first and second pcell instances to re-generate at least one of the first and second chain sets so that the first and second chain sets align with each other in the layout design when the first poly feature and the second ploy feature are aligned with each other in the layout design.

20. The system of claim 18 further including:
wherein successively aligning poly features in chain order in a first horizontal direction includes,
for each successive most recently aligned poly feature, determining an adjacent poly feature that is farthest from a most recently aligned poly feature in the first horizontal direction in its chain and adjusting spacing of the other adjacent poly feature in the other chain to align it with the determined farthest adjacent poly feature.

\* \* \* \* \*